(12) United States Patent
Den et al.

(10) Patent No.: US 7,319,069 B2
(45) Date of Patent: Jan. 15, 2008

(54) STRUCTURE HAVING PORES, DEVICE USING THE SAME, AND MANUFACTURING METHODS THEREFOR

(75) Inventors: Tohru Den, Tokyo (JP); Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 11/354,813

(22) Filed: Feb. 16, 2006

(65) Prior Publication Data

US 2006/0138394 A1    Jun. 29, 2006

Related U.S. Application Data

(62) Division of application No. 09/666,605, filed on Sep. 20, 2000, now abandoned.

(30) Foreign Application Priority Data

Sep. 22, 1999   (JP)   ................. 11-268483
Sep. 4, 2000    (JP)   ............... 2000-266773

(51) Int. Cl.
*H01L 21/44*   (2006.01)

(52) U.S. Cl. ................... 438/667; 438/409; 438/399; 257/3; 257/13; 257/14; 257/E21.577; 977/781; 977/893

(58) Field of Classification Search .............. None
See application file for complete search history.

(56) References Cited

U.S. PATENT DOCUMENTS 5,165,991 A   11/1992   Fukuda et al.   ............ 428/306.6

(Continued)

FOREIGN PATENT DOCUMENTS

EP   0 913 508   5/1999

(Continued)

OTHER PUBLICATIONS

Masuda, "Metal nanohole array having high regularity formed of anodized alumina," KOTAIBUTSURI (Solid State Physics) 31, vol. 31, No. 5, pp. 493-499 (1996).

(Continued)

*Primary Examiner*—Sue A. Purvis
*Assistant Examiner*—Scott R. Wilson
(74) *Attorney, Agent, or Firm*—Fitzpatrick, Cella, Harper & Scinto

(57) ABSTRACT

A minute structure is provided in which electroconductive paths are only formed in nanoholes, and a material is filled in the nanoholes, which are disposed in a specific area, by using the electroconductive paths. The minute structure comprising pores comprises a) a substrate, b) a plurality of electroconductive layers formed on a surface of the substrate, c) a layer primarily composed of aluminum oxide covering the plurality of electroconductive layers and a surface of the substrate where no electroconductive layer is formed, and d) a plurality of pores formed in the layer primarily composed of aluminum oxide, in which the pores are disposed above the electroconductive layers and the surface of the substrate where no electroconductive layers is formed, with a part of the layer primarily composed of aluminum oxide provided under the bottoms of the pores, and in which the layer primarily composed of aluminum oxide provided between the electroconductive layer and the bottoms of the pores disposed above the electroconductive layer comprises a material forming the electroconductive layer.

18 Claims, 9 Drawing Sheets

U.S. PATENT DOCUMENTS

| | | | |
|---|---|---|---|
| 5,581,091 A * | 12/1996 | Moskovits et al. | 257/9 |
| 6,172,902 B1 * | 1/2001 | Wegrowe et al. | 365/158 |
| 6,194,255 B1 | 2/2001 | Hiroki et al. | 438/151 |
| 6,278,231 B1 | 8/2001 | Iwasaki et al. | 313/310 |
| 6,350,623 B1 | 2/2002 | Scherer et al. | 438/3 |
| 6,476,409 B2 | 11/2002 | Iwasaki et al. | 257/13 |
| 6,628,053 B1 | 9/2003 | Den et al. | 313/310 |
| 2004/0173914 A1 * | 9/2004 | Kurihara et al. | 257/778 |

FOREIGN PATENT DOCUMENTS

| | | |
|---|---|---|
| EP | 0 951 047 | 10/1999 |
| JP | 11-139815 | 5/1999 |
| JP | 11-194134 | 7/1999 |
| JP | 11-200090 | 7/1999 |
| JP | 11-233004 | 8/1999 |
| JP | 2000-31462 | 1/2000 |

OTHER PUBLICATIONS

R. C. Furneaux, et al., "The formation of controlled-porosity membranes from anodically oxidized aluminium", Nature, vol. 337, pp. 147-149 (1989).

* cited by examiner

12 PORES    11

PRIOR ART

STRUCTURE HAVING PORES, DEVICE USING THE SAME, AND MANUFACTURING METHODS THEREFOR

This application is a divisional of application Ser. No. 09/666,605, filed Sep. 20, 2000 now abandoned, the contents of which are incorporated herein by reference.

BACKGROUND OF THE INVENTION

1. Field of the Invention

The present invention relates to minute structures, devices having minute structures, and manufacturing methods thereof. In particular, the present invention relates to a nanoscale structure, a device using the nanoscale structure, and manufacturing methods thereof. The nanoscale structure of the present invention provided with alumina nanoholes can be widely used as a functional material and as a structural material for electronic devices and micro devices. The present invention can be particularly applied to quantum effect devices, electrochemical sensors, biosensors, magnetic memory devices, magnetic devices, light-emitting devices, photonic devices, solar cells, and the like.

2. Description of the Related Art

Since the movement of electrons is constrained when thin films, thin wires, and dots of a metal and a semiconductor are smaller than the distinctive length (such as mean free path or spin scattering length) thereof, they may exhibit unique electrical, optical, and chemical characteristics in some cases. From the point of view mentioned above, minute structures (nanostructures) smaller than 100 nanometers (nm), have attracted significant attention as a functional material.

As a method for manufacturing the nanostructure, semiconductor processing techniques, such as fine pattern drawing techniques including photolithography, electron-beam lithography, x-ray lithography, and the like, may be mentioned as examples.

In addition to the method mentioned above, attempts to realize a novel nanostructure using a structure having naturally formed regularity, i.e., a structure which is formed in a self-organizing manner, have been made. Depending on the minute structure used as the base structure, the method mentioned above has the possibility of producing a fine and unique structure superior to that obtained by the conventional method. As a result, much research has been initiated in this area. As an example of a unique structure formed in a self-organizing manner, an anodized alumina film may be considered (refer to R. C. Furneaux et al, "The formation of controlled-porosity membranes from anodically oxidized aluminium" Nature, vol. 337, p. 147 (1989), and the like).

When an aluminum (Al) plate is anodized in an acidic electrolyte, a porous oxide film is formed. FIG. 9 is a schematic cross-sectional view showing a nanostructure having a porous alumina nanohole layer 11 formed on an Al plate 31 by anodization thereof. As shown in FIG. 9, the characteristic of the anodized alumina film is a unique geometric structure thereof, in which extremely fine pores (nanoholes) 12 having diameters $2r$ of a few nm to a few hundreds of nm are disposed at a few tens of nm to a few hundreds of nm intervals $2R$ therebetween. The nanoholes 12 have high aspect ratios. In addition, between the anodized alumina nanoholes 12 and the Al substrate, barrier layers (aluminum oxide layers) 22 exist.

Focusing on the unique geometric structure of alumina nanoholes formed by anodization, various applications thereof have been implemented. Application of anodized films to films using abrasion resistance and insulating properties thereof and application to filters obtained by peeling anodized films are as examples. In addition, by filling the nanoholes with a metal, a semiconductor, or the like or by using a replica of nanoholes (by using nanoholes as a mold), various applications to coloration, a magnetic recording medium, an electroluminescent (EL) light-emitting device, an electrochromic device, an optical device, a solar cell, a gas sensor, and the like have been pursued. Furthermore, applications in various fields have been anticipated, such as a quantum effect device including a quantum thin wire, a metal insulator metal (MIM) device, a molecular sensor using nanoholes as a chemical reaction field, and the like (see Masuda, "Metal nanohole array having high regularity formed of anodized alumina", KOTAIBUTSURI (Solid State Physics) 31, vol. 31, no. 5, pp. 493-499 (1996), Japanese Patent Laid-Open No. 11-200090).

Concerning the formation of a nanostructure by using semiconductor processing techniques described above, there are problems in that the production yield is low and the apparatuses therefor are costly. Hence, a simple and reproducible manufacturing method has been desired. In view of the points described above, the method using self-organization, in particular, the method of anodizing Al, has advantages in that a nanostructure can be easily and controllably formed.

Since the nanostructure shown in FIG. 9 is only formed on an Al plate surface, the application and the shape thereof are limited to some extent. For example, since the melting point of Al is 660° C., nanoholes formed on the surface thereof cannot be subjected to heating to or above the above-mentioned temperature. Consequently, in order to use nanoholes as a functional material in various fields, a novel technique has been awaited in which an anodized alumina film can be formed on a substrate having a higher melting point without impairing the unique geometric structure of the anodized alumina or cracking at higher temperatures.

When applications of the minute structure described above to devices are considered, it is important that the pores be filled with a functional material and that a plurality of pores be selectively filled with a functional material.

SUMMARY OF THE INVENTION

Accordingly, it is an object of the present invention to solve the problems described above and to provide a novel and effective minute structure.

One aspect of the present invention is to provide a minute structure in which a plurality of pores having electroconductive paths is selectively disposed above a substrate and to provide a manufacturing method therefor.

Another aspect of the present invention is to provide a minute structure in which a material is selectively filled in some of the plurality of pores disposed above a substrate and to provide a manufacturing method therefor.

Another aspect of the present invention is to provide a nanostructure device using the nanostructure described above.

Another aspect of the present invention is to provide manufacturing methods for the nanostructure and for the nanostructure device mentioned above.

A structure having pores according to the present invention comprises a) a substrate, b) a plurality of electroconductive layers formed on a surface of the substrate, c) a layer primarily composed of aluminum oxide covering the plurality of electroconductive layers and a surface of the substrate where no electroconductive layer is formed, and d)

a plurality of pores formed in the layer primarily composed of aluminum oxide, in which the plurality of pores is disposed above the plurality of electroconductive layers and the surface of the substrate where no electroconductive layer is formed, with a part of the layer primarily composed of aluminum oxide provided under the plurality of pores, and in which the layer primarily composed of aluminum oxide, which is provided between the electroconductive layers and the bottoms of pores disposed above the electroconductive layer, comprises a material forming the electroconductive layer.

In addition, a method for manufacturing a structure having pores according to the present invention comprises the steps of (A) preparing a substrate, (B) forming a plurality of electroconductive layers each composed of at least one element selected from the group consisting of Ti, Zr, Hf, Nb, Ta, Mo, and W on a part of a surface of the substrate, (C) forming a film primarily composed of aluminum so as to cover the plurality of electroconductive layers and a surface of the substrate having no electroconductive layer thereon, and (D) anodizing the film primarily composed of aluminum so as to form a layer primarily composed of aluminum oxide having a plurality of pores, in which the plurality of pores is formed above the electroconductive layers and the surface of the substrate having no electroconductive layer thereon, and in which a material forming the electroconductive layer is diffused to a part of the layer primarily composed of aluminum oxide provided between the electroconductive layers and the bottoms of pores above the electroconductive layers.

A device according to the present invention comprises the structure having pores described above.

In addition, an electron-emitting device according to the present invention comprises an electron-emitting material filled in the pores described above.

Furthermore, a magnetic device according to the present invention comprises a magnetic material filled in the pores described above.

A light-emitting device according to the present invention also comprises a light-emitting material filled in the pores described above.

Further objects, features, and advantages of the present invention will become apparent from the following description of the preferred embodiments (with reference to the attached drawings).

DESCRIPTION OF THE PREFERRED EMBODIMENTS

Hereinafter, the present invention which solves the problems described above will be described in detail.

As an example of the structure of the present invention, a nanoscale structure (a nanostructure) will be described.

The structure of the present invention described herein is a structure comprising a substrate having a first major surface and a second major surface opposing each other and a layer having pores therein disposed on the first major surface. In the structure described above, an electroconductive layer is provided between the layer having pores and the first major surface, electroconductive paths, which electrically connect the electroconductive layer and each bottom edge portion of the pores, are provided in the layer having pores, and the electroconductive layer is patterned so as to be of a desired shape.

Figure 1A:
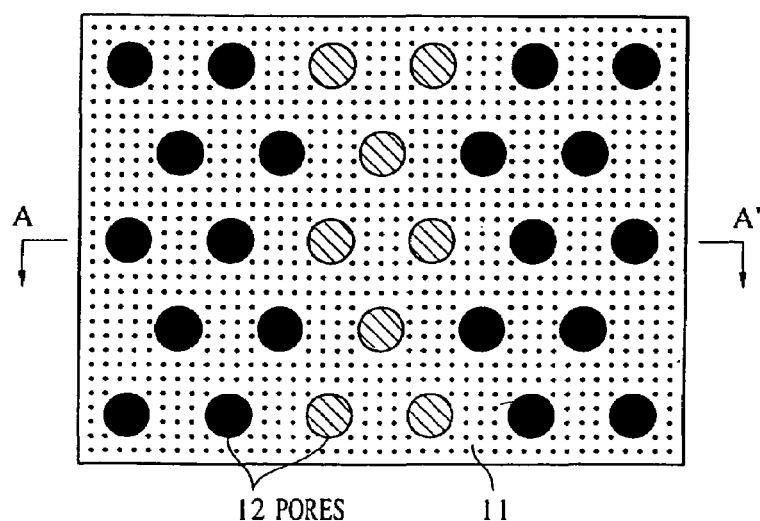
FIGS. 1A and 1B are schematic views showing a structure of the present invention.
Figure 1B:
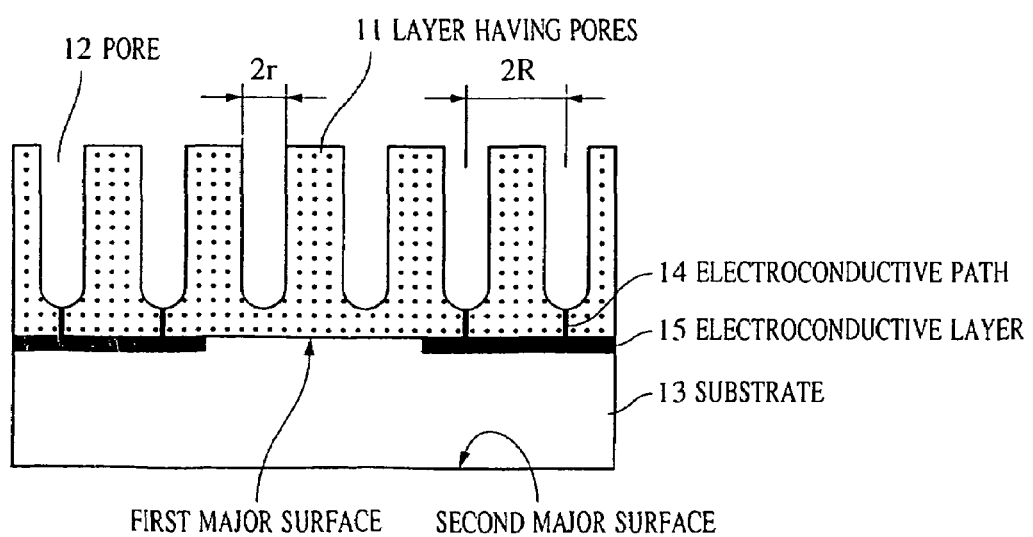

Hereinafter, the case in which a substrate in the form of a plate having a first and a second major surface opposing each other, as shown in FIG. 1B, will be described as an example. However, the present invention will not be limited to the substrate described above, and specifically, any substrate which is suitable for anodization may be used as described below. In the present invention, a substrate having at least one substantially flat surface is preferably used. In addition, a substrate having at least a substantially planar surface is preferably used. That is, the shape of a surface having no layer provided with pores thereon (a second surface in FIG. 1B) is not significant.

The nanostructure described above of the present invention will be described in detail with reference to the figures.

FIGS. 1A and 1B are schematic views showing the nanostructure of the present invention. FIG. 1A is a plan view of the nanostructure, and FIG. 1B is a cross-sectional view of the nanostructure taken along the line A-A' in FIG. 1A. In FIGS. 1A and 1B, numeral 11 indicates a layer having pores 12, numeral 13 indicates a substrate having a first and a second major surface, numeral 14 indicates an electroconductive path, and numeral 15 indicates an electroconductive layer (a metal layer). The first major surface described above is a surface of the substrate provided with the layer 11 having the pores 12.

When the structure described above is formed by anodizing a film (layer) primarily composed of aluminum (Al), the layer 11 having pores may be called "a layer having pores disposed therein primarily composed of aluminum oxide", "a layer having pores primarily composed of aluminum oxide", or "an alumina nanohole layer" in some cases.

When the layer 11 having pores described above is formed by anodization, a film to be anodized is preferably primarily composed of Al. However, another material may be used for a film to be anodized, as long as the material can form pores therein by anodization. In general, formation of the film primarily composed of Al is performed by sputtering or by heat resistance deposition. In addition, there is a method in which an Al foil is used as an Al film, and an electroconductive layer (a metal layer) is formed on one surface thereof. In this case, the thickness of the Al foil is preferably 500 μm or less.

The electroconductive layer (the metal layer) 15 is preferably composed of Ti, Zr, Hf, Nb, Ta, Mo, W, or the like as a major component. However, a single metal mentioned above, a mixture thereof, or a mixture with another material may be used. The composition of the electroconductive layer 15 is determined by anodizing conditions, requirements for heat stability, and the like. The formation of the electroconductive layer mentioned above is also generally performed by sputtering or by heat resistance deposition.

The electroconductive layer 15 is patterned so as to be a desired shape. The electroconductive layer 15 optionally has an appropriate form corresponding to a modified embodiment of the structure having pores. For example, the electroconductive layer 15 may be formed of a plurality of electroconductive layers. In addition, the electroconductive layer 15 may be formed so as to have portions thereof (notches or the like) opposing each other with a space therebetween at which the surface of the substrate is exposed.

The inventors of the present invention discovered that ions of a material forming the electroconductive layer 15 migrate to an alumina layer (barrier layer) when anodization of an aluminum portion is completed and oxidation of the electroconductive layer 15 begins, thereby forming the electroconductive paths 14. The electroconductive path 14 tends to be thicker as anodizing time increases. When a metal, a semiconductor, or the like is filled in the pores 12 by electrodeposition, since the electroconductive path 14 works as an electrode, it is preferable that the electroconductive path 14 be thicker to some extent.

When the layer 11 having pores is a layer primarily composed of aluminum oxide (in particular, in the case in which aluminum oxide is obtained by anodizing aluminum), the layer 11 having pores is primarily composed of Al and oxygen and has a number of columnar pores 12 therein, and the depth directions of the pores (nanoholes) 12 can be disposed approximately perpendicular to the first major surface of the substrate. In addition, individual pores can be disposed substantially parallel to each other and can be disposed at approximately regular intervals therebetween. The term "parallel" indicates that the depth directions of individual pores 12 are substantially parallel to each other.

Furthermore, the pores can be disposed so as to form triangular (honey comb arrangement) as shown in FIG. 1A. The diameter 2r of a nanohole is a few nm to a few hundreds of nm, and the interval 2R therebetween is approximately a few tens of nm to a few hundreds of nm as shown in FIG. 1B.

When the layer 11 having pores is obtained by anodizing a film primarily composed of aluminum, the thickness of the layer 11 having pores and the depths of the pores thereof can be controlled by the thickness of the film primarily composed of Al before anodizing.

The thickness of the film primarily composed of Al mentioned above is preferably 10 nm to 500 μm. Conventionally, the depths of pores are generally controlled by anodizing time; however, in the present invention, it can be controlled by the thickness of the film primarily composed of Al, so that an alumina nanohole layer having superior uniformity in the depths of pores can be formed.

When a material is selectively filled in desired pores 12 by using electrodeposition, the significance of the effect of patterning of the electroconductive layer 15 can be understood. In addition to electrodeposition, chemical vapor deposition (CVD), electrophoresis, coating, infiltration, or the like may be used.

Figure 7A:
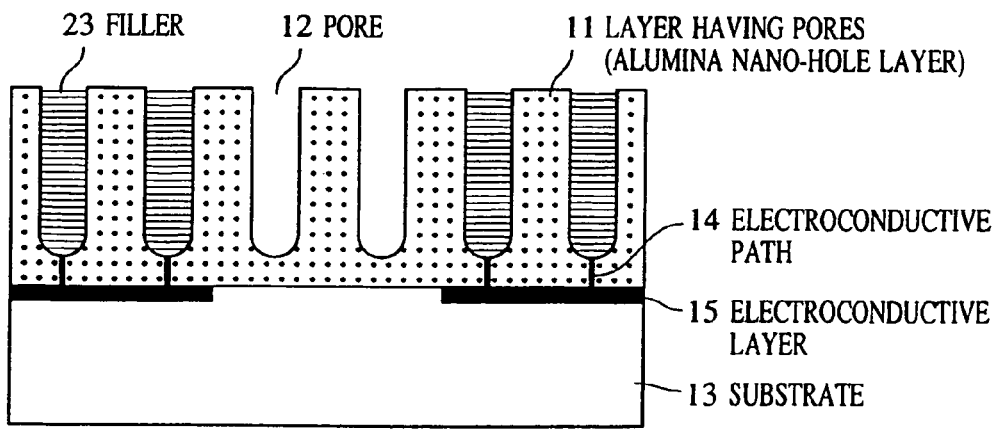
FIGS. 7A to 7C are cross-sectional views showing states in which a filler is filled in pores of a structure of the present invention.

When a material (a filler) to be filled in pores is a magnetic material, the structure obtained therefrom may be used as a magnetic medium as an effective perpendicular magnetic film, and when the structure is a thin wire of a magnetic or a metallic material, the structure may be used as an effective quantum effect device. In addition, when cobalt (Co) and copper (Cu) are formed alternately in pores as shown in FIG. 7A, a giant magnetoresistive effect (GMR) device having a pattern responding to a magnetic field may be produced.

In addition, when a filler material 23 is a light-emitting material or a fluorescent material, a wavelength-converting layer in addition to a light-emitting device may be formed. Furthermore, when a filler material is a dielectric material other than alumina, an effective photonic device may be formed. In the case mentioned above, a filler material patterned therein is very effective.

Hereinafter, an example of a method for manufacturing the structure of the present invention will be described with reference to FIGS. 2A to 6B. In this case, an example will be described in which a material is filled in pores by electrodeposition.

Figure 2A:
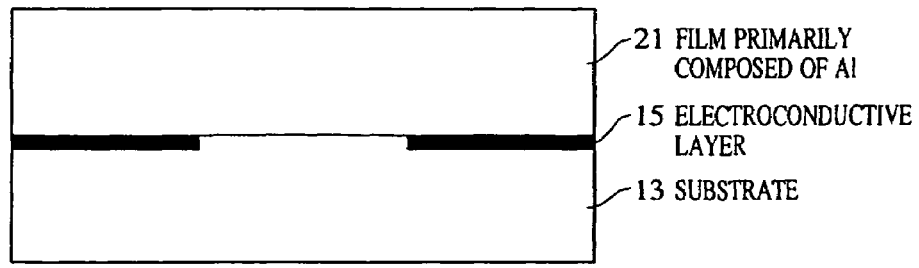
FIGS. 2A to 2C are schematic cross-sectional views showing manufacturing steps of a structure of the present invention.
Figure 2B:
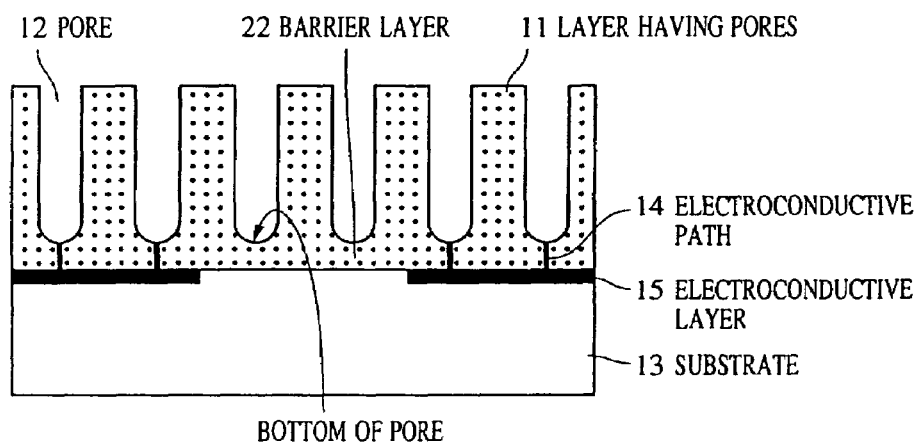
Figure 2C:
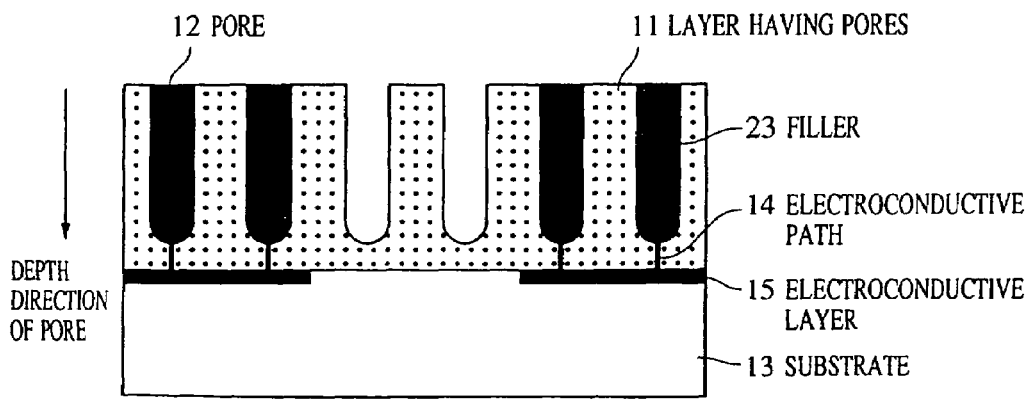
Figure 3:
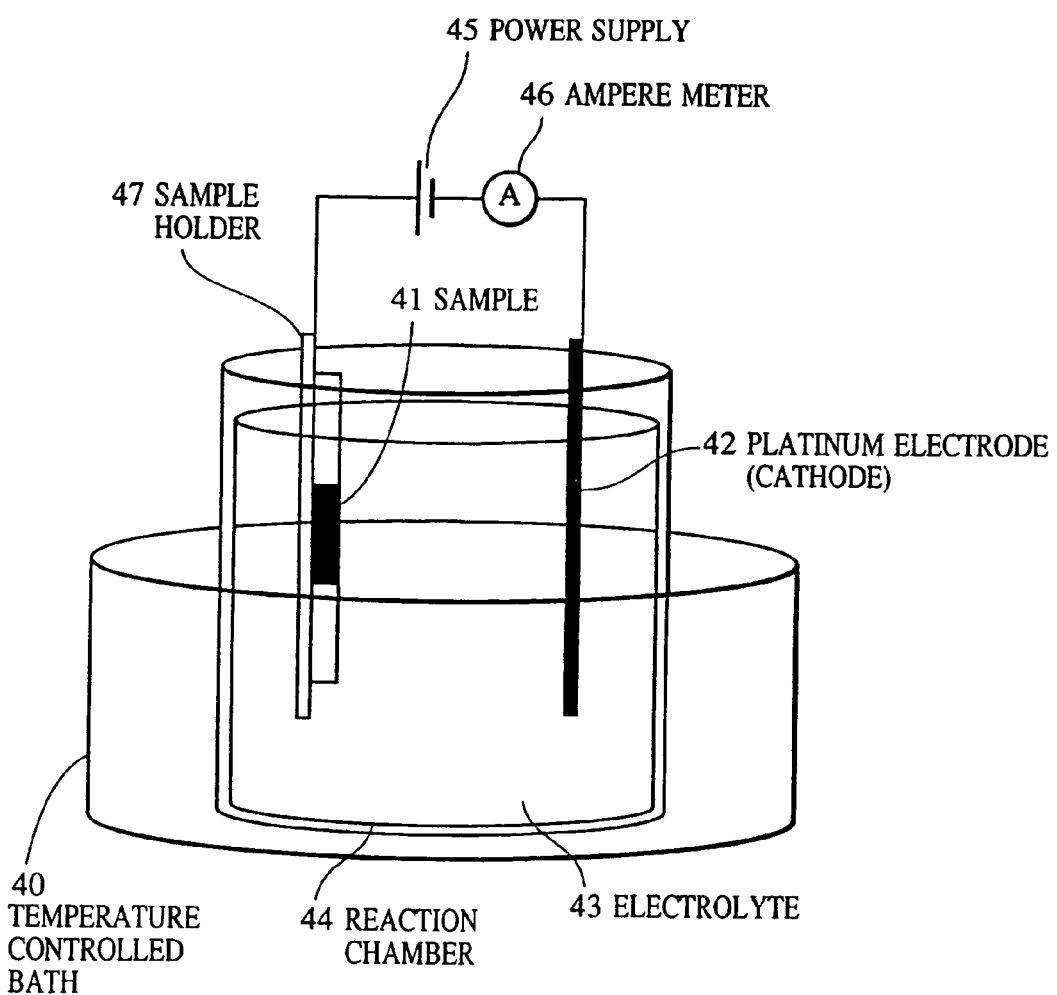
FIG. 3 is a schematic view showing an anodization apparatus.
Figure 4:
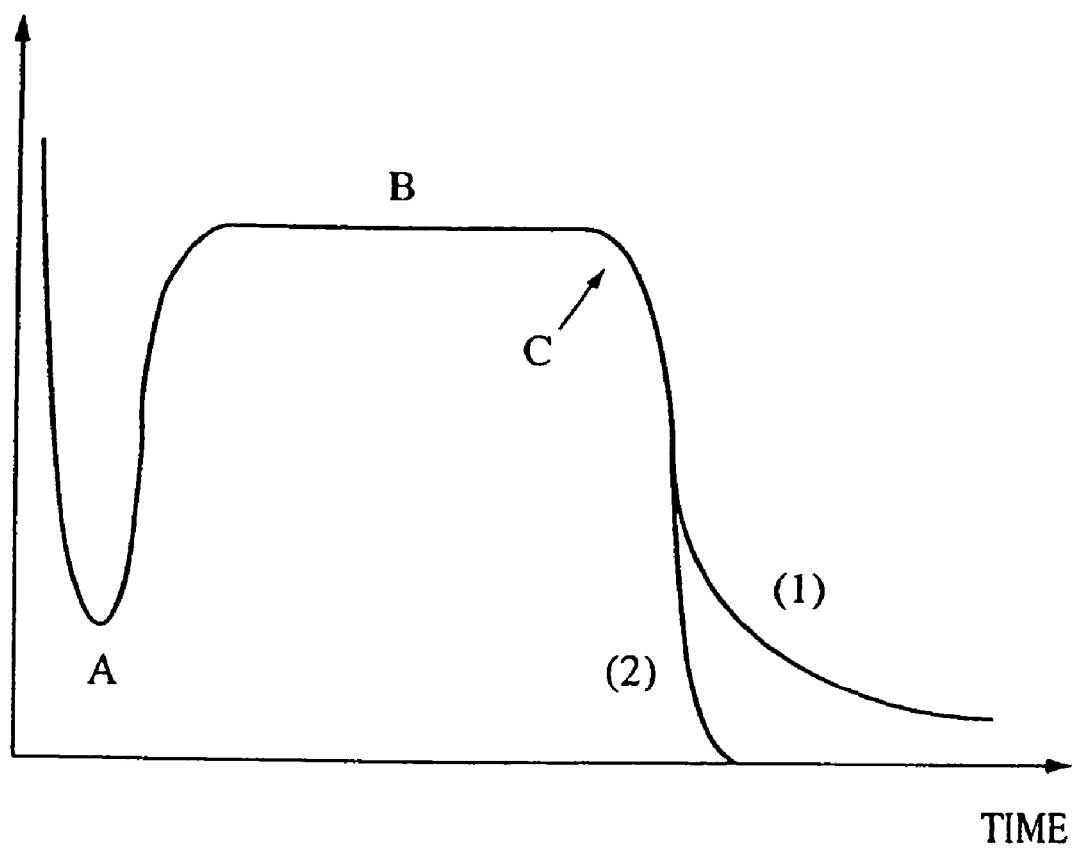
FIG. 4 is a graph showing a current profile during anodization in the manufacturing method of a structure of the present invention.

FIGS. 2A, 2B, and 2C are schematic views showing manufacturing steps of the structure of the present invention, FIG. 3 is a schematic view showing an anodization apparatus, FIG. 4 is a graph showing a current profile during anodization, and FIGS. 5A, 5B, 6A, and 6B are schematic views showing reaction steps of a film 21 primarily composed of Al disposed on the electroconductive layer 15 in FIG. 2A.

Manufacturing steps for forming a layer having pores (an alumina nanohole layer) by anodizing an aluminum film will be described.

The following steps (a) to (c) correspond to FIGS. 2A to 2C, respectively.

(a) Step of Film Formation

A substrate 13 having a first major surface and a second major surface opposing each other is prepared.

Next, the electroconductive layer (the metal layer) 15 described above is formed in a desired shape on the first major surface mentioned above.

Subsequently, the film 21 primarily composed of Al (the film to be anodized) is continuously formed on the electroconductive layer 15 and on the first major surface of the substrate 13 where the electroconductive layer 15 is not formed thereon.

Patterning of the electroconductive layer (the metal layer) 15 of the present invention can be performed by common semiconductor techniques, such as photolithography, metal mask film formation, and the like. Various patterning arrangement may be performed in accordance with applications of a structure having pores.

The following may be considered examples; however, the present invention is not limited thereto.

1) a patterned electroconductive layer (a metal layer) is disposed on an insulating substrate or an insulating layer, 2) a patterned insulating layer is disposed on an electroconductive (a metal) substrate or an electroconductive layer (a metal layer), 3) an electroconductive layer (a metal layer) is formed on a substrate and is then partly insulated, and 4) an insulating layer is formed on a substrate and is partly electrically conductive.

In the case of 1) described above, as the substrate 13, a substrate composed of an insulating material or a film composed of an insulating material provided on a first major surface of an electroconductive substrate may be used.

In the case of 2) described above, as the substrate 13, a substrate composed of an electroconductive material, such as a metal or a semiconductor, or a film composed of an electroconductive material provided on a first major surface of an insulating substrate may be used.

In the case of 1) described above, the thickness of the electroconductive layer to be used is preferably 1 nm to 1 μm and more preferably, 5 nm to 0.5 μm, taking account of the anodization electrode and the surface flatness of a layer to be anodized primarily composed of Al.

In the case of 2) described above, the thickness of the insulating layer to be used is preferably 1 nm to 1 μm and more preferably, 5 nm to 0.5 μm, in view of the surface flatness of a layer to be anodized primarily composed of Al.

Depending on the thickness of the film 21 (the film to be anodized) primarily composed of Al, steps (or recesses) reflecting the pattern of the electroconductive layer (or the insulating layer) 15 may be formed on the surface of the film 21 primarily composed of Al. As a result, depending on the depths of the recesses (or the steps), which are approximately equivalent to the thickness of the electroconductive layer (or the insulating layer), and spaces between the adjacent recesses, which are approximately equivalent to the spaces between the adjacent electroconductive layers (or the insulating layers), in the anodizing step described later, anodization (pore formation) may occur preferentially from the recesses described above. Consequently, pores 12 formed on the electroconductive layer and pores 12 formed on the insulating layer may have shapes different from each other in some cases. Alternatively, the pores may not reach the electroconductive layer 15 in some cases.

On the other hand, in the present invention, in order to uniformly form pores above the electroconductive layer and the insulating layer, the flatness of the film 21 (the film to be anodized) primarily composed of Al must be improved in the case of 1) or 2) above. Accordingly, in the present invention, the thickness of the film 21 primarily composed of Al is set to be not less than 2 times the thickness of the patterned electroconductive layer (or insulating layer) 15, preferably not less than 5 times, and more preferably, not less than 10 times.

By setting the thickness of the film 21 primarily composed of Al and the thickness of the electroconductive layer (or the insulating layer) 15 as described above, pores can be formed without depending on recesses (or steps) formed on the film 21 primarily composed of Al.

In addition, instead of the method described above, the surface of the film 21 primarily composed of Al may be planarized after the formation thereof, and anodization may then be performed. The planarization mentioned above may be performed by surface polishing, such as chemical etching and electrolytic polishing.

According to the methods described above, in the case 1) or 2) above, pores, which are substantially similar to each other, can be formed above the patterned electroconductive layer (or the insulating layer) and the insulating layer (or the electroconductive layer).

In addition, the film 21 primarily composed of Al and the electroconductive layer 15, which is also called an electrode since it is being used as an electrode during anodization, can be formed by an optional method, such as resistance heating deposition, electron beam (EB) deposition, sputtering, or CVD.

(b) Anodization

Anodization of the film 21 primarily composed of Al is conducted to form the alumina nanohole layer. Anodization can be performed using an anodization apparatus shown in FIG. 3. In FIG. 3, numeral 40 indicates a temperature-controlled bath, numeral 41 indicates a sample, which is typically the substrate 13 provided with the film 21 primarily composed of Al formed in the previous step described above, numeral 42 indicates a cathode formed of a platinum (Pt) plate, numeral 43 indicates an electrolyte, numeral 44 indicates a reaction chamber, numeral 45 indicates a power supply applying an anodizing voltage, numeral 46 indicates an ampere meter measuring an anodizing current, and numeral 47 indicates a sample holder. In addition to these mentioned above, a computer for automatic control and measurement of a voltage and a current, and the like (not shown in the figure) are provided therewith.

The sample 41 and the cathode 42 are placed in the electrolyte 43 in which the temperature is kept constant by the temperature-controlled bath 40, and anodization is performed by applying a voltage between the sample 41 and the cathode 42 by the power supply 45.

A solution of oxalic acid, phosphoric acid, sulfuric acid, or chromic acid may be used, for example, as the electrolyte 43 used for anodization. Preferably, a solution of sulfuric acid at a low voltage up to approximately 30 V, a solution of phosphoric acid at a high voltage of 80 V or more, and a solution of oxalic acid at a voltage therebetween may be used.

Figure 5A:
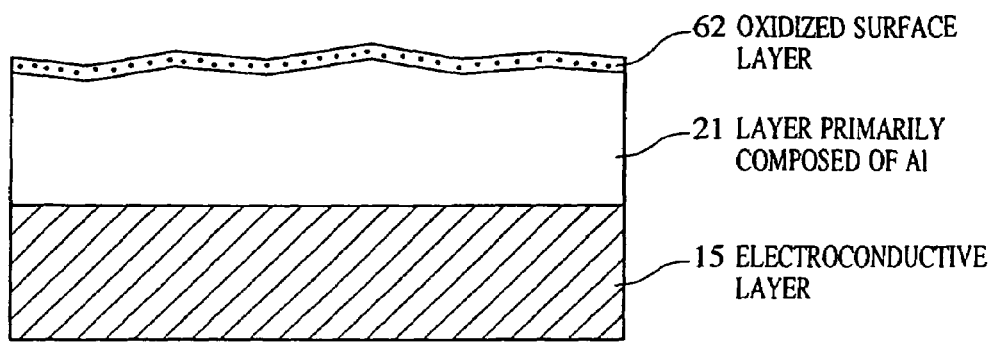
FIGS. 5A and 5B are cross-sectional views showing states in anodization in the manufacturing method of a structure of the present invention.
Figure 5B:
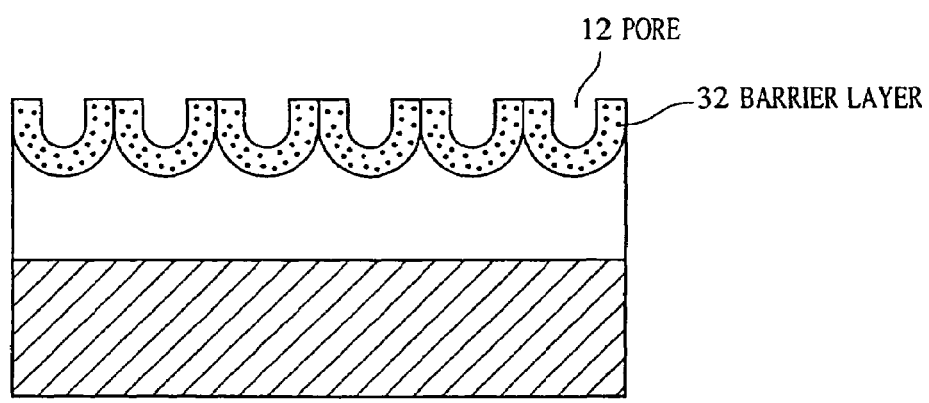
Figure 6A:
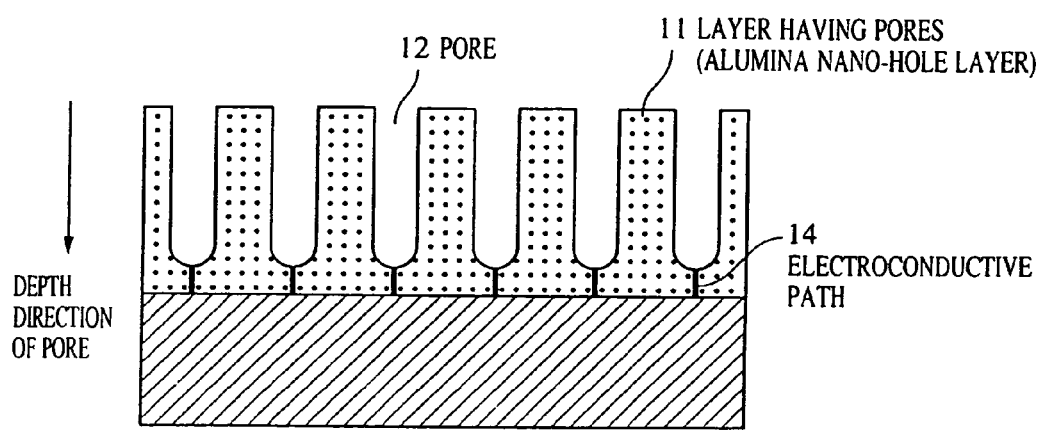
FIGS. 6A and 6B are cross-sectional views showing states in which electroconductive paths are formed by a diffusion process at the bottoms of pores of a structure of the present invention.
Figure 6B:
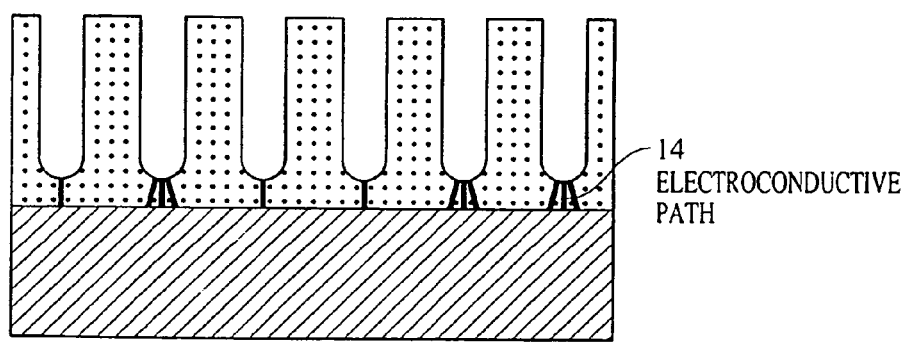

When anodization in an aqueous solution of oxalic acid is performed using the electroconductive layer 15 as an electrode provided with the film 21 primarily composed of Al formed thereon, the current rapidly drops initially, since the surface of the film 21 primarily composed of Al is oxidized (A in FIG. 4 and FIG. 5A). Subsequently, the current gradually increases concomitant with the formation of pores (nanoholes) and reaches approximately constant value (B in FIG. 4 and FIG. 5B). When the anodization reaches the electroconductive layer 15 and the substrate 13, the current decreases since the oxidation of Al and diffusion of Al ions into an aqueous solution are suppressed (C in FIG. 4).

In this stage, an alumina-insulating layer (a barrier layer 22 in FIG. 2B) is formed at the bottom edge portions of the pores (nanoholes) 12 disposed above the insulating layer (substrate 13). In FIG. 4, the current profile during anodization is indicated by (2) in which the film 21 primarily composed of Al formed on the insulating layer is anodized.

On the other hand, during the anodization, when the electroconductive layer 15 is composed of a material such as Ti, Zr, Hf, Nb, Ta, Mo, or W, and a film 21 primarily composed of Al formed on the electroconductive layer 15 is anodized, the anodizing current gradually decreases after the anodization of Al is complete, as indicated by (1) in FIG. 4. During the decrease in current, electroconductive paths 14 are gradually formed in an alumina layer (an oxide layer) at the bottoms of the pores (nanoholes). The electroconductive paths 14 begin to form at the onset of the decrease in current (FIG. 6A), and subsequently, the electroconductive paths 14 are thicker and the number thereof increases (FIG. 6B) through anodization.

The "electroconductive path" described above is an area, which is formed by diffusion of a material contained in the electroconductive layer 15 to the alumina layer caused by anodization, composed of an oxide or a hydroxide containing elements of the electroconductive layer 15 and is disposed in the insulating layer (alumina layer) at the bottom of the nanohole 12. When the cross-section of the conductive path 14 is observed by an electron microscope (e.g. transmission electron microscope), the aforementioned area extending from the electroconductive layer 15 to the interior of the nanohole 12 through the insulating layer (alumina layer) at the bottom of the nanohole 12 clearly exists. According to the compositional analysis of this electroconductive path, a significant amount of the element contained in the electroconductive layer 15 is detected.

The electroconductive path is primarily composed of an oxide of the element forming the electroconductive layer 15 and has electric conductivity. In order to further increase conductivity in the electroconductive path, it is preferable that the layer having the pores (the alumina nanohole layer) be annealed in a reducing atmosphere using, for example, hydrogen.

Accordingly, as a major component of the electroconductive layer 15, it is particularly preferable to use tungsten (W), since W is easily reduced, the coefficient thereof is similar to that of alumina, and the melting point thereof is high among metals. In particular, when the present invention is used as an electron emission source, the characteristics mentioned above are significant. In addition, the oxide of W also has high ion conductivity, so that it can also be used for chemical applications.

In order to sufficiently form the electroconductive paths described above, it is important to stop the anodization when a decrease of 50% or more of constant oxidation current (B in FIG. 4) is observed.

In addition, when the arrangement of pores is regulated, uniformity of the shapes, such as the diameters of pores (nanoholes) and uniformity of electroconductive paths at the bottoms of the pores (nanoholes) are improved. For performing the regulation mentioned above, it is preferable that recesses be formed at appropriate intervals therebetween on the surface of the film 21 primarily composed of Al and that the recesses be used as starting points for forming the pores.

Next, by immersing the structure formed by the manufacturing method described above in an acidic solution, such as a solution of phosphoric acid, the diameters of pores (nanoholes) can be optionally increased. When a concentration of an acid, an immersing time, and a temperature are properly controlled, a structure provided with pores (nanoholes) having uniform diameters can be obtained.

(c) Electrodeposition

In the case in which a metal is selectively electrodeposited in pores formed above the electroconductive layer 15, a layer (alumina nanohole layer) having pores (nanoholes) is immersed in a solution in which a metal to be electrodeposited is present as cations, and a voltage is applied to the electroconductive layer 15. For example, an aqueous solution of cobalt sulfate may be used as the solution mentioned above. In addition, prior to electrodeposition, the electric conductivities of the electroconductive paths 14 are preferably increased by annealing in a reducing atmosphere using hydrogen or the like, since the efficiency of electrodeposition can be improved. As described above, as shown in FIG. 2C, a filler 23 can be selectively disposed in the pores above the electroconductive layer 15.

In addition, in order to generate sufficient nuclei during electrodeposition, as a voltage applied to the electroconductive layer 15, an alternating voltage or a pulse voltage is preferably applied.

On the other hand, in the case in which anions are electrodeposited or oxidation is concurrently executed, an application of a positive voltage may be required at some times. In the case mentioned above, an alternating voltage or a pulse voltage is also preferably applied to the electroconductive layer 15.

In the case described above, precipitation of hydroxides by electrolytic oxidation may also occur during electrodeposition. That is, a reaction (I) shown below occurs on the surface of the anode. In addition, when there is another ion, it may be incorporated in the precipitation. That is, a reaction (II) shown below may occur in some cases.

$M^{n+}+nOH^-\rightarrow M(OH)_n$, in which M is a metal ion     Reaction (I)

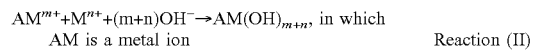
$AM^{m+}+M^{n+}+(m+n)OH^-\rightarrow AM(OH)_{m+n}$, in which AM is a metal ion     Reaction (II)

Figure 7B:
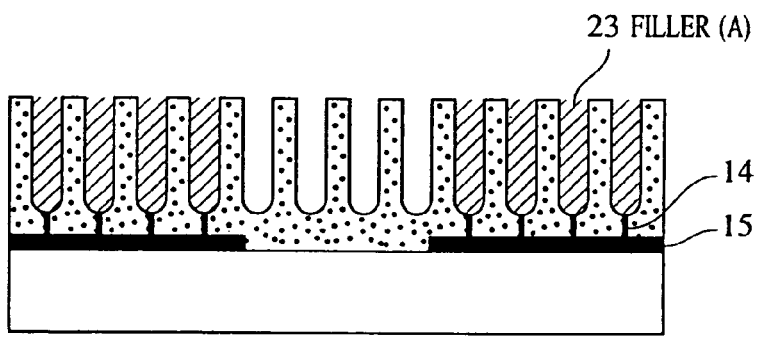
Figure 7C:
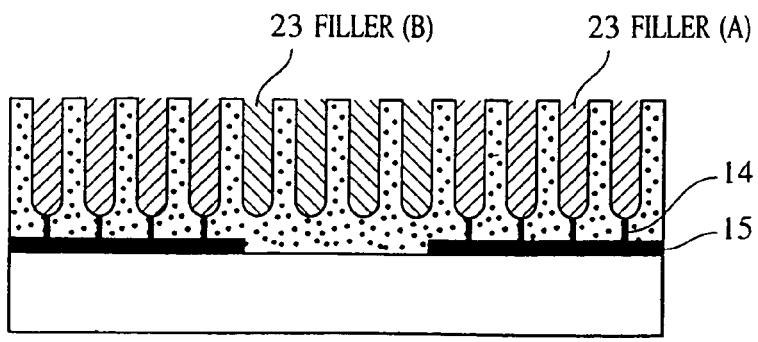

As shown in FIGS. 7B and 7C, according to the present invention, after a desired material (A) is selectively filled in the pores (nanoholes) only disposed above the electroconductive layer 15, another material (B) can be filled in the other pores (nanoholes) by infiltration, CVD, or the like. As described above, different materials can be filled in different pores in accordance with the pattern of the electroconductive layer 15 as shown in FIG. 7C.

In the case in which the electroconductive layer 15 is composed of a plurality of electroconductive layers, a different material can be filled in pores disposed above a different electroconductive layer. Furthermore, pores filled with a different material can be disposed in each area of the individual electroconductive layers on the same substrate 13.

After filling a desired material in the nanoholes by electrodeposition or the like, it is sometimes effective for the surface of the nanohole layer (a structure having pores) to be planarized so as to be flat.

The alumina nanohole layer obtained from the manufacturing method described above according to the present invention can be applied to various forms, such as a quantum thin wire, a MIM device, a molecular sensor, a coloration application, a magnetic recording medium, an EL light-emitting device, an electrochromic device, an optical device, a solar cell, a gas sensor, an abrasive resistance and insulating film, and a filter.

According to the manufacturing method of the present invention, pores having the electroconductive paths can be selectively disposed only in the desired area on the same substrate.

In addition, according to the manufacturing method of the present invention, a material, such as a metallic material, can be filled selectively in the pores in a desired area of a structure having a plurality of nanoscale pores. In particular, according to the present invention, by simply patterning the electroconductive layer formed on the substrate, a material, such as a metallic material, can be filled in the desired pores.

As described above, according to the manufacturing method of the present invention, in order to fill only desired pores with a material filled after pore formation, a patterning step for removing or masking unwanted pores is not necessary. When the patterning mentioned above is performed after pore formation, there may actually be serious damage to the nanoscale pores, such as contamination of the pores, breakage of the pores, changes in the shapes of the pores, and the like. Accordingly, since patterning the formed pores is not required in the manufacturing method of the present invention, the method described above is significantly effective.

In addition, when an electroconductive layer and a layer primarily composed of Al to be anodized are patterned prior to anodization and are then anodized, an undesirable phenomenon occurs in which the arrangement of pores is disrupted, particularly at portions of patterned edges. As a result, material to be filled in pores is not uniformly electrodeposited, and a desired structure is difficult to manufacture.

When an x-direction wiring and a y-direction wiring (a matrix wiring) are formed with the layer having pores therebetween, it is preferable that the top and the bottom wirings be formed with a uniform aluminum layer therebetween, so the arrangement of the pores at the edge portions is not disrupted, as described above. In addition, in the case in which a device is produced which is effective when a material is filled in a part of the layer disposed between the top and bottom wirings and is not effective when a material is filled in the entire layer disposed therebetween, a material can be filled in some of the pores by utilizing a part of the bottom wiring as an electroconductive layer, as described above. When the manufacturing method described above is effectively used, a top matrix wiring can be formed in a minute area, even if, for example, an easy selective film formation by using a metal mask is employed. Furthermore, in the case in which matrix driving is performed at a higher speed, the layer in which a material is filled in some of the pores is more advantageous, since the capacitance thereof is smaller than a layer in which a material is filled in all the pores.

According to the structure having pores of the present invention, pores selectively filled with a material differing from the others can be disposed in each desired area on the same substrate. In addition, when a plurality of electroconductive layers is disposed so as to be electrically isolated from each other, the composition, quantity, and quality of a material to be filled in pores can be altered in each desired area on the same substrate.

As described above, the structure having pores of the present invention is a structure in which pores exist above both electroconductive layer 15 and the insulating layer (an area at which the electroconductive layer is not disposed), "electroconductive paths" are provided at the bottoms of pores disposed above the electroconductive layer 15, and no "electroconductive path" is provided at the bottoms of pores disposed above the insulating layer. Accordingly, when the structure having pores of the present invention is used, a structure can be formed in which, for example, a light-emitting material can be selectively filled by electrodeposition in the pores connected to the electroconductive layer 15 via the electroconductive paths, and no material is filled in the pores other than the pores mentioned above. The structure described above can produce a device in which the intensity of light-emitting wavelengths observed (output) can be altered between the depth direction of the pores and the direction perpendicular thereto.

The reason the device thus described can be produced is believed to be as follows. Since the pores receiving a light-emitting material therein, i.e., a dielectric material, and the pores receiving no material therein are regularly disposed, a two-dimensional photonic device is formed, and a photonic band gap for a specific wavelength is formed in a direction perpendicular to the depth direction of the pores, whereby the light of that wavelength is difficult to transmit.

Hereinafter, referring to the Examples, the present invention will be described.

EXAMPLES

Example 1

In this example, electrodeposition and the shapes of pores when aluminum nanohole layers are formed using various electroconductive layers will be described with reference to FIGS. 2A to 2C. Seven samples were made. In each sample, materials used to make the electroconductive films 15 are different from each other.

a) Formation of Electroconductive Layer 15 and Al Film 21

A resist (Hitachi Chemical Co., Ltd., RD-2000N) 1 μm thick was formed by spin-coating on a quartz substrate 13, and a line 10 μm wide was then exposed using a mask and developed. Subsequently, an electroconductive film 100 nm thick was formed by RF sputtering. As a material for the electroconductive films, Ti, Zr, Hf, Nb, Ta, Mo, and W were respectively used to each sample. The conditions for film formation were set so that the pressure in an Ar atmosphere was 30 mTorr, and the RF power was 500 W. By peeling the resist using a lift-off method, a 10 μm-wide electroconductive layer 15 was formed.

Subsequently, a 1 μm-thick Al film 21 was formed by DC sputtering, whereby a structure shown in FIG. 2A was formed. The conditions for film formation were set so that the pressure in an Ar atmosphere was 20 mTorr, and the DC power was 1,500 W.

b) Anodization

Anodization was performed using an anodization apparatus in FIG. 3.

In this example, an aqueous solution of oxalic acid at a concentration of 0.3 M and an aqueous solution of phosphoric acid at a concentration of 0.3 M were used as an electrolyte, and the electrolyte was maintained at 3° C. in a temperature-controlled bath. The anodizing voltage was DC 40 to 100 V, and the electroconductive layer 15 was used as an electrode. During anodization, in order to detect a current indicating the time when anodization of Al, which started from the surface thereof, reached the electroconductive layer 15, an anodizing current was monitored. The completion of anodization was set to be a point at which a current, after passing the point C shown in FIG. 4, was sufficiently decreased. The time-dependence of an anodizing current during anodization is indicated by (1) in FIG. 4.

After anodization, rinsing using distilled water and isopropyl alcohol was performed, and the diameters of the formed nanoholes were then optionally increased by etching by immersing the sample in a solution of phosphoric acid at a concentration of 5 percent by weight for 45 to 90 minutes.

When the surface and cross-section of the sample obtained were observed by a field emission-scanning electron microscope (an FE-SEM), the Al layer was entirely anodized so as to form aluminum oxide as shown in FIG. 2B, a barrier layer 22 was present at the bottom of the pores (nanoholes) 12 in an area at which an underlayer was the quartz substrate, and on the other hand, electroconductive paths 14 were observed in the barrier layer above the electroconductive layer 15.

In addition, it was confirmed that diameters of the pores (nanoholes) could be controlled by a pore-widening treatment mentioned above.

c) Electrodeposition

Next, Co pillars (a filler) 23 were formed by electrodeposition in nanoholes disposed above the electroconductive layer 15 of the sample. Cobalt sulfate at a concentration of 5% and boric acid at a concentration of 2% were used as a plating solution, and the AC voltage and the electrodeposition time were respectively set to be 5 V and 30 seconds.

The samples were annealed at 500° C. in an $H_2$ atmosphere for 1 hour prior to electrodeposition, and seven samples for backup were electrodeposited without annealing, which were formed in a manner equivalent to that used for the aforementioned seven samples.

When the cross-sections of the samples were observed by an FE-SEM, the Co pillars were mostly electrodeposited uniformly in the pores above the electroconductive layer 15, and nearly no Co was electrodeposited in the pores above the quartz substrate. Electrodeposition was more uniformly performed in the pores of the annealed sample than in the pores of the sample which was not annealed. The reason for this is believed to be that conductivity of a material forming conductive paths is increased by reduction thereof by heating in an $H_2$ atmosphere.

It was discovered that selective electrodeposition in the pores 12 can be performed by patterning the electroconductive layer 15.

Next, the surface of the sample electrodeposited with Co was polished using diamond powder, and subsequently, the sample was disposed so that a magnetic field is parallel to the Co pillars and was then magnetized at 0.8 tesla (T). When the sample was observed by a magnetic force microscope (an MFM), it was confirmed that the Co pillars were uniformly magnetized in the vertical direction (an axial direction of the nanoholes).

Accordingly, it was understood that the present invention could be applied to a magnetic memory and the like.

Example 2

In this example, an anodized alumina nanohole layer was formed in a manner similar to that in Example 1.

In this example, a substrate 13 was a quartz substrate, and W was sputtered on the substrate 13 so as to be 100 nm thick and was then patterned by a lift-off method. Anodization was performed in a solution of oxalic acid at a voltage of 40 V at a bath temperature of 10° C. and was completed 10 minutes after passing the point C in FIG. 4 at which the anodizing current was sufficiently low. Similarly to Example 1, a pore-widening treatment was performed in a solution of 5 percent by weight of phosphoric acid for 40 minutes.

The sample and a counter electrode made of platinum were immersed in an electrolyte composed of cobalt sulfate at a concentration of 0.5 M and copper sulfate at a concentration of 0.005 M, and an alternating voltage of 5 V at 50 Hz was applied between the sample and the counter electrode, whereby nuclei of an alloy composed of cobalt and copper were deposited at the bottom of the nanoholes. Subsequently, voltages of –0.5 V and –1.2 V were alternately applied for 20 seconds and 0.1 second, respectively, so that a layered pillar composed of cobalt and copper was grown from the bottom of the nanoholes, whereby a nanostructure shown in FIG. 7A was formed.

When a voltage of –0.5 V was applied, only copper that had a lower electrolytic voltage was electrodeposited, and when a voltage of –1.2 V was applied, primarily cobalt, which was at a higher concentration, was electrodeposited, whereby the layered pillar mentioned above could be obtained.

Subsequently, a magnetic field dependence of resistance between the electroconductive layer and an electrode mounted at the upper portion of the nanostructure of this example was measured, and a negative magnetic field dependence of resistance was observed.

As described above, it was understood that the present invention could be applied to a magnetic sensor having a patterned structure.

Example 3

In this example, formation of an alumina nanohole layer provided with a patterned electroconductive layer 15 composed of Nb formed on a quartz substrate 13 and infiltration of an oxide in pores 12 were performed.

On the quartz substrate 13 provided with the 100 nm-thick patterned electroconductive layer 15 composed of Nb, a 5 µm-thick Al film 21 was formed (FIG. 2A).

Next, recesses arranged in the form of a honeycomb (a hexagonal grating) were formed on the surface of the Al film 21 by lithography. The space between recesses was set to be 300 nm.

Subsequently, by performing anodization in a manner similar to that in Example 1, pores 12 (nanoholes) were formed above the substrate 13. In the anodization, a solution of phosphoric acid at a concentration of 0.3 M was used as an electrolyte, the voltage was set to be 140 V, and the completion of anodization was set to be at a time sufficiently long after a decrease in current at the point C in FIG. 4. A pore-widening treatment was then performed for 75 minutes.

The sample processed by the pore-widening treatment was immersed in an aqueous solution of zinc nitrate at a concentration of 0.1 M at 60° C. together with a counter electrode composed of platinum, and –0.8 V to a reference electrode of Ag/AgCl was applied between the sample and the counter electrode, whereby ZnO crystals were grown in the nanoholes.

When the surface of the sample was observed by an FE-SEM, the pores 12 were regularly disposed, and it was confirmed that ZnO crystals only grew in the pores above the patterned electroconductive layer 15 composed of Nb, as shown in FIG. 7B.

According to the result of this example, it was understood that ZnO could be filled in specific anodized alumina nanoholes.

Since ZnO functions as a light-emitting material and a fluorescent material and is different from adjacent alumina in terms of dielectric constant, it was understood that the present invention could be applied to optical devices.

Photoluminescence was measured by applying ultraviolet light to the ZnO portion. The results were that a broad light emission of 400 to 700 nm centered at 500 nm was detected by photoluminescence observation from the upper portion of the substrate, and a decrease in light-emission, at a longer wavelength from approximately 600 nm, was detected by photoluminescence observation from the lateral direction of the substrate. As described above, when pores receiving no material therein and pores receiving material therein are disposed on a highly regular basis, a device can be obtained in which the intensity of a light-emitting wavelength observed (output) can be altered between the direction perpendicular to the first major surface of the substrate and the direction parallel thereto.

The reason for this is believed to be that a part of the alumina nanohole layer having regularly disposed pores without ZnO therein functions as a two-dimensional photonic crystal, and hence, a photonic band gap is formed in a longer wavelength region.

Example 4

In this example, an alumina nanohole layer was formed by anodization in a manner similar to that in Example 1. In this example, a substrate 13 was a quartz substrate, a film was formed on the substrate 13 by sputtering Nb, and the film was subsequently patterned by a lift-off method so as to form an electroconductive layer 15 shown in FIG. 8. Anodization was performed in a solution of oxalic acid at a concentration of 0.3 M at 40 V. When the electroconductive layer 15 was composed of Nb, since the current monotonically decreased with time as indicated by (1) in FIG. 4, anodization was completed when the current is one-tenth of the current in the region B in FIG. 4 (a constant oxidation current). Subsequently, a pore-widening treatment was performed in a manner similar to that in Example 1.

Figure 8:
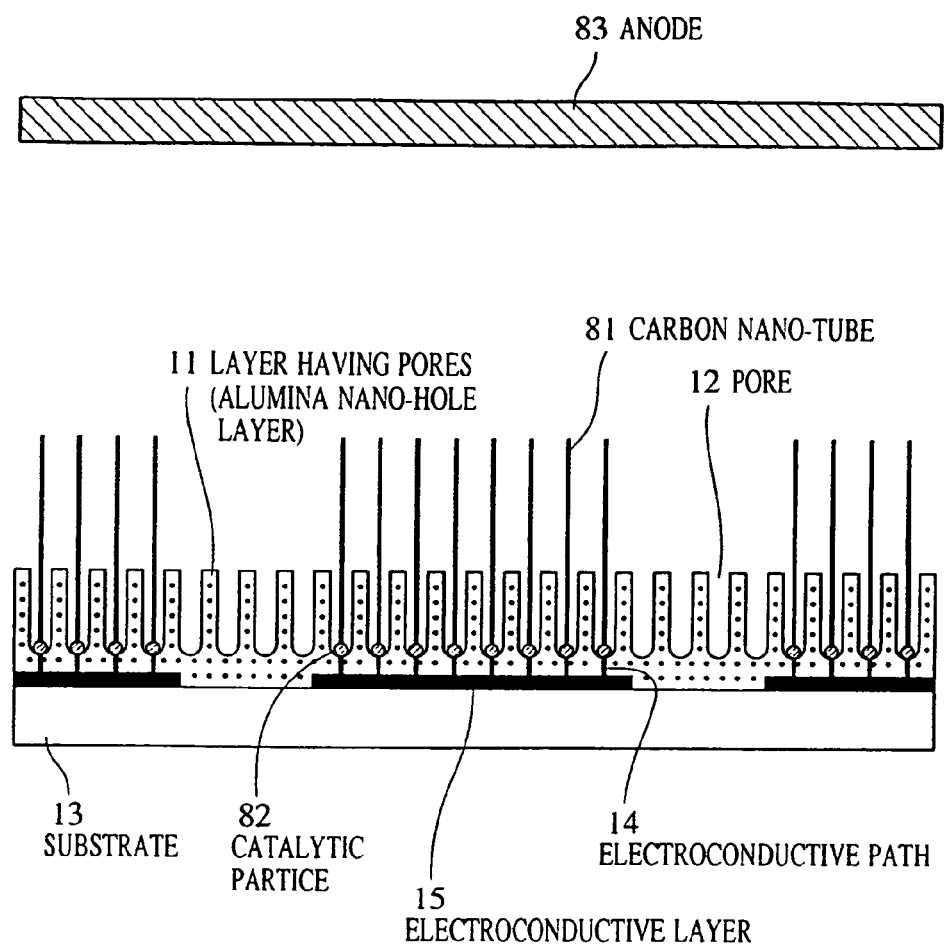
FIG. 8 is a schematic view showing an example of a carbon nanotube device of the present invention.
Figure 9:
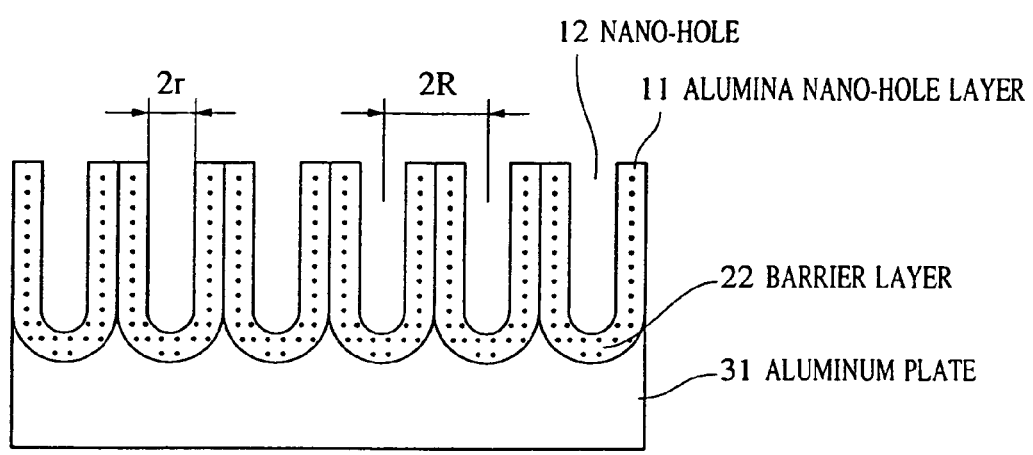
FIG. 9 is a schematic view showing conventional anodized alumina nanoholes on an Al plate.

The sample was electrodeposited with cobalt in a plating solution composed of cobalt sulfate at a concentration of 5% and boric acid at a concentration of 2%, and at an alternating voltage of 5 V for 3 seconds, whereby fine catalytic particles 82 were electrodeposited in nanoholes 12 as shown in FIG. 8.

When the cross-section of the electrodeposited sample was observed by an FE-SEM, it was confirmed that electroconductive paths 14 primarily composed of Nb were formed in an alumina-insulating layer above the electroconductive layers 15. In addition, fine cobalt particles (fine catalytic particles 82) were only electrodeposited at the bottoms of the pores (nanoholes) above the electroconductive layers 15. Furthermore, when the sample was annealed at 500° C. in an $H_2$ atmosphere prior to electrodeposition, the uniformity of electrodeposition of cobalt was improved. The reason for this is believed to be that conductivity of the electroconductive paths is improved by annealing in a reducing atmosphere.

Subsequently, by heating the sample in a mixed gas composed of 2% of ethylene ($C_2H_4$) and 98% of helium (He) at 750° C. for 1 hour, pillars primarily composed of carbon (carbon nano-tubes) 81 could be grown from the fine catalytic particles 82.

When the sample was observed by an FE-SEM, as shown in FIG. 8, it was confirmed that the carbon nano-tubes were selectively grown from the pores (nanoholes) having the fine catalytic particles 82 therein. The diameters of the carbon nano-tubes 81 were a few nm to a few tens of nm.

When an anode 83 composed of a fluorescent material is provided in a vacuum apparatus so as to oppose the carbon nano-tubes 81 and to be spaced 1 mm therefrom, and when a voltage of 1 kV was applied to the anode, an electron-emitting current, in addition to fluorescence from the fluorescent material, was observed.

Accordingly, it was confirmed that the carbon nano-tube device of this example could work as a superior electron-emitting material having electron-emitting points at predetermined portions thereof.

According to the results obtained from the examples, it can be confirmed that the present invention has the following advantages.

In order to produce electronic devices and photonic devices, it is significantly effective to perform electrodeposition selectively in nanoholes in desired areas.

As has thus been described, the following advantages can be obtained by the present invention.

When a structure having pores is formed by anodization, by patterning an electroconductive layer composed of a metal containing Ti, Zr, Hf, Nb, Ta, Mo, or W, electroconductive paths can only be formed in the interiors of the nanoholes above the patterned electroconductive layer. In addition, by using the electroconductive paths thus formed, a material can be filled in the nanoholes in the desired areas. Accordingly, when the structure according to the present invention is used, a quantum effect device, an electrochemical sensor, an optical device, a magnetic device, a superconducting device, and the like can be realized.

The anodized alumina nanohole layer can be used in various applications, and the range of the applications thereof is significantly broad.

The minute structure of the present invention can be used as a functional material by itself, and it can also be used as a basic material and/or a mold for a novel minute structure.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a structure having pores comprising the steps of:
   preparing a substrate;
   forming a plurality of electroconductive layers each composed of at least one element selected from the group consisting of Ti, Zr, Hf, Nb, Ta, Mo, and W on a part of a surface of the substrate;
   forming a film primarily composed of aluminum so as to cover the plurality of electroconductive layers and a surface of the substrate having no electroconductive layer thereon; and
   anodizing the film primarily composed of aluminum so as to form a layer primarily composed of aluminum oxide having a plurality of pores;
   wherein the plurality of pores is formed above the plurality of electroconductive layers and the surface of the substrate having no electroconductive layer thereon,
   wherein a material forming an electroconductive layer of the plurality of electroconductive layers is diffused to a part of the layer primarily composed of aluminum oxide provided between the electroconductive layer and the bottom of the pores above the electroconductive layer, and
   wherein the electroconductive layer is an electroconductive film formed on a surface of the substrate, and the film primarily composed of aluminum is formed so that the thickness thereof is not less than two times the thickness of the electroconductive layer.

2. A method for manufacturing a structure having pores according to claim 1, wherein the substrate comprises an insulating material.

3. A method for manufacturing a structure having pores according to claim 1, wherein the substrate comprises an electroconductive substrate and a film composed of an insulating material provided on the electroconductive substrate.

4. A method for manufacturing a structure having pores according to claim 1, wherein the film primarily composed of aluminum is formed so that the thickness thereof is not less than five times the thickness of the electroconductive layer.

5. A method for manufacturing a structure having pores according to claim 1, wherein the film primarily composed of aluminum is formed so that the thickness thereof is not loss than ten times the thickness of the electroconductive layer.

6. A method for manufacturing a structure having pores according to claim 1, further comprising a step of increasing the diameter of tho pores by etching after the anodizing step.

7. A method for manufacturing a structure having pores according to claim 1, further comprising a step, prior to the anodizing step, of forming a recess on a surface of the film primarily composed of aluminum disposed so as to cover the plurality of electroconductive layers and the surface of the substrate having no eloctroconductive layer thereon.

8. A method for manufacturing a structure having pores according to claim 1, further comprising a step of depositing a material selectively in at least one pore disposed above the electroconductive layer by applying a voltage thereto in a solution, wherein the material deposited in the pore by electrodeposition is ionized in the solution.

9. A method for manufacturing a structure having pores according to claim 8, wherein the voltage applied to the electroconductive layer is an alternating voltage or a pulse voltage.

10. A method for manufacturing a structure having pores comprising the steps of:
preparing a substrate;
forming a patterned electroconductive layer composed of at least one element selected from the group consisting of Ti, Zr, Hf, Nb, Ta, Mo, and W on a part of a surface of the substrate;
forming a film primarily composed of aluminum so as to cover the eloctroconductive layer and a surface of the substrate having no electroconductive layer thereon; and
anodizing the film primarily composed of aluminum so as to form a layer primarily composed of aluminum oxide having a plurality of pores;
wherein the plurality of pores is formed above the electroconductive layer and the surface of the substrate having no electroconductive layer thereon,
wherein a material forming the electroconductive layer is diffused to a part of the layer primarily composed of aluminum oxide provided between the electroconductive layer and the bottom of the pores above the electroconductive layer, and
wherein the electroconductive layer is an electroconductive film formed on a surface of the substrate, and the film primarily composed of aluminum is formed so that the thickness thereof is not less than two times the thickness of the electroconductive layer.

11. A method for manufacturing a structure having pores according to claim 10, wherein the substrate comprises an insulating material.

12. A method for manufacturing a structure having pores according to claim 10, wherein the substrate comprises an electroconductive substrate and a film composed of an insulating material provided on the electroconductive substrate.

13. A method for manufacturing a structure having pores according to claim 10, wherein the film primarily composed of aluminum is formed so that the thickness thereof is not less than five times the thickness of the electroconductive layer.

14. A method for manufacturing a structure having pores according to claim 10, wherein the film primarily composed of aluminum is formed so that the thickness thereof is not less than ten times the thickness of the electroconductive layer.

15. A method for manufacturing a structure having pores according to claim 10, further comprising a step of increasing the diameter of the pores by etching after the anodizing step.

16. A method for manufacturing a structure having pores according to claim 10, further comprising a step, prior to the anodizing step, of forming a recess on a surface of the film primarily composed of aluminum disposed so as to cover the electroconductive layer and the surface of the substrate having no electroconductive layer thereon.

17. A method for manufacturing a structure having pores according to claim 10, further comprising a step of depositing a material selectively in at least one pore disposed above the electroconductive layer by applying a voltage thereto in a solution, wherein the material deposited in the pore by electrodeposition is ionized in the solution.

18. A method for manufacturing a structure having pores according to claim 17, wherein the voltage applied to the electroconductive layer is an alternating voltage or a pulse voltage.

* * * * *

UNITED STATES PATENT AND TRADEMARK OFFICE
CERTIFICATE OF CORRECTION

PATENT NO. : 7,319,069 B2 Page 1 of 1
APPLICATION NO. : 11/354813
DATED : January 15, 2008
INVENTOR(S) : Den et al.

It is certified that error appears in the above-identified patent and that said Letters Patent is hereby corrected as shown below:

COVER SHEET:
Abstract, Line 13, "layers" should read -- layer --.

COLUMN 6:
Line 54, "arrangement" should read -- arrangements --.

COLUMN 17:
Line 2, "loss" should read -- less --; and
Line 6, "the" should read -- the --.

Signed and Sealed this

Eleventh Day of November, 2008

JON W. DUDAS
*Director of the United States Patent and Trademark Office*